United States Patent
Shirakawa et al.

(10) Patent No.: US 10,546,769 B2
(45) Date of Patent: Jan. 28, 2020

(54) SEMICONDUCTOR MANUFACTURING METHOD AND SEMICONDUCTOR MANUFACTURING DEVICE

(71) Applicant: Toshiba Memory Corporation, Tokyo (JP)

(72) Inventors: Tatsuhiko Shirakawa, Yokkaichi Mie (JP); Kenji Takahashi, Oita Oita (JP); Eiji Takano, Oita Oita (JP); Masaya Shima, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 192 days.

(21) Appl. No.: 15/059,994

(22) Filed: Mar. 3, 2016

(65) Prior Publication Data

US 2016/0276200 A1  Sep. 22, 2016

(30) Foreign Application Priority Data

Mar. 17, 2015  (JP) .................................. 2015-053842

(51) Int. Cl.
*H01L 21/683* (2006.01)
(52) U.S. Cl.
CPC ..... *H01L 21/6835* (2013.01); *H01L 2221/68318* (2013.01); *H01L 2221/68327* (2013.01); *H01L 2221/68381* (2013.01)
(58) Field of Classification Search
CPC .................................................. H01L 21/6835
See application file for complete search history.

(56) References Cited

U.S. PATENT DOCUMENTS

| | | | |
|---|---|---|---|
| 7,534,498 B2* | 5/2009 | Noda | B32B 43/006 428/446 |
| 7,759,050 B2 | 7/2010 | Kessel et al. | |
| 9,308,715 B2 | 4/2016 | Imai et al. | |
| 2002/0090772 A1* | 7/2002 | Higashi | H01L 21/0237 438/166 |
| 2009/0115075 A1 | 5/2009 | Kessel et al. | |

(Continued)

FOREIGN PATENT DOCUMENTS

| | | |
|---|---|---|
| TW | 201350244 A | 12/2013 |
| WO | 2004006296 A2 | 1/2004 |

OTHER PUBLICATIONS

Taiwan Office Action dated Aug. 25, 2017, filed in Taiwan counterpart Application No. 104138994, 5 pages (with translation).

(Continued)

*Primary Examiner* — Moazzam Hossain
*Assistant Examiner* — Hajar Kolahdouzan
(74) *Attorney, Agent, or Firm* — Kim & Stewart LLP

(57) ABSTRACT

According to one embodiment, a semiconductor manufacturing method for a stacked body that includes a semiconductor substrate, a supporting substrate containing silicon, and a joining layer arranged between the semiconductor substrate and the supporting substrate to joint the semiconductor substrate and the supporting substrate, in which a surface of the semiconductor substrate opposite to the joining layer is to be ground, includes irradiating the stacked body with electromagnetic wave having energy of 0.11 to 0.14 eV from a side of the supporting substrate, and separating the semiconductor substrate from the supporting substrate.

17 Claims, 4 Drawing Sheets

(56) References Cited

U.S. PATENT DOCUMENTS

| | | |
|---|---|---|
| 2012/0118511 A1 | 5/2012 | Imai et al. |
| 2012/0146240 A1* | 6/2012 | Dairiki ............... H01L 21/6835 |
| | | 257/777 |
| 2014/0166209 A1 | 6/2014 | Imai et al. |
| 2015/0017434 A1 | 1/2015 | Dronen et al. |

OTHER PUBLICATIONS

Taiwan Office Action dated Jan. 25, 2017, filed in Taiwan counterpart Application No. 104138994, 11 pages (with translation).
Taiwanese Office Action dated Dec. 20, 2017, filed in counterpart Taiwanese Patent Application No. 104138994, 8 pages (with Translation).
Japanese Office Action dated Jun. 22, 2018, filed in counterpart Japanese Patent Application No. 2015-053842 (5 pages) (with machine translation).
Chinese First Office Action dated Feb. 14, 2018 filed in counterpart Chinese Patent Application No. 201510848886.X (16 pages) (with Translation).

\* cited by examiner

SEMICONDUCTOR MANUFACTURING METHOD AND SEMICONDUCTOR MANUFACTURING DEVICE

CROSS-REFERENCE TO RELATED APPLICATION

This application is based upon and claims the benefit of priority from Japanese Patent Application No. 2015-053842 filed Mar. 17, 2015, the entire contents of which are incorporated herein by reference.

FIELD

An embodiment described herein relates generally to a semiconductor manufacturing method and a semiconductor manufacturing device.

BACKGROUND

In the semiconductor manufacturing process, a wafer having been previously processed to form integrated circuits therein and/or thereon is thinned. Thinning is performed while the wafer is bonded (temporary bonding) to a transparent (to light) supporting substrate by a joining layer. Further, in order to make the thinned wafer easily separate from the supporting substrate, a photothermal conversion layer that is converted by the energy of visible light is provided between the wafer and the supporting substrate. Then, after thinning the wafer, by irradiating the photothermal conversion layer with visible light from the supporting substrate side of the stack, the properties of the photo thermal conversion layer are changed, allowing separation of the wafer from the supporting substrate.

In the above method, however, the material of the supporting substrate is limited to a transparent material, such as glass. Therefore, the degree of freedom in selecting the material of the supporting substrate is desired to be increased.

DETAILED DESCRIPTION

According to an embodiment, there is provided a semiconductor manufacturing method and a semiconductor manufacturing device capable of increasing the degree of freedom for selection of the material of a supporting substrate used during the thinning of a semiconductor substrate.

In general, according to one embodiment, a semiconductor manufacturing method for a stacked body including a semiconductor substrate, a supporting substrate containing silicon, and a joining layer arranged between the semiconductor substrate and the supporting substrate to join the semiconductor substrate and the supporting substrate, in which a surface of the semiconductor substrate opposite to a side of the joining layer is ground is provided, the method including irradiating the stacked body with electromagnetic waves having energy of 0.11 to 0.14 eV from the supporting substrate side of the stack, and thereafter separating the semiconductor substrate from the supporting substrate.

Hereinafter, an embodiment will be described with reference to the drawings. This embodiment does not limit the scope of the invention.

The semiconductor manufacturing method according to the embodiment includes manufacturing a stacked body, thinning a semiconductor substrate, embrittling a joining layer, and separating the semiconductor substrate from the stacked body, in this order. These processes will be hereinafter described together with an apparatus and structures for carrying out the respective processes.

(Stacked Body Manufacturing Process)

According to the semiconductor manufacturing method, at first, a stacked body manufacturing process is performed.

Here, the structure example of a stacked body will be described.

Figure 1A:
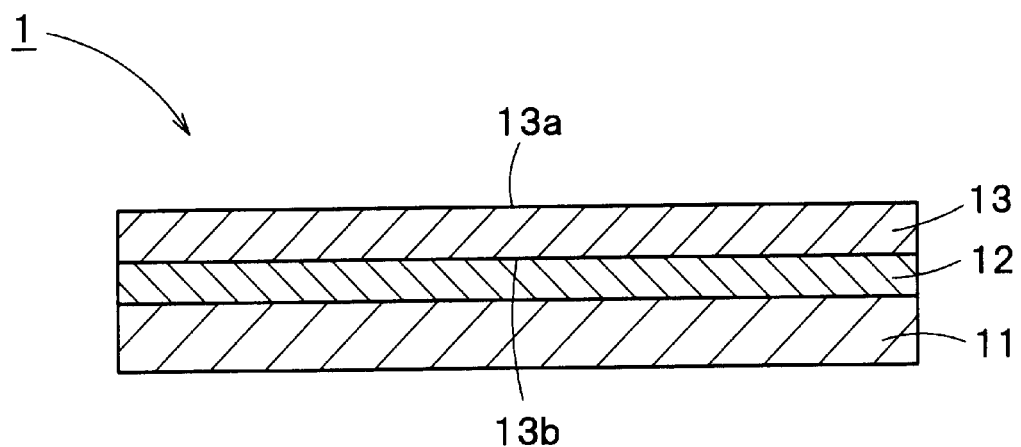
FIGS. 1A to 1C are schematic cross-sectional views of a stacked body which may be used for a semiconductor manufacturing method according to the embodiment.
Figure 1B:
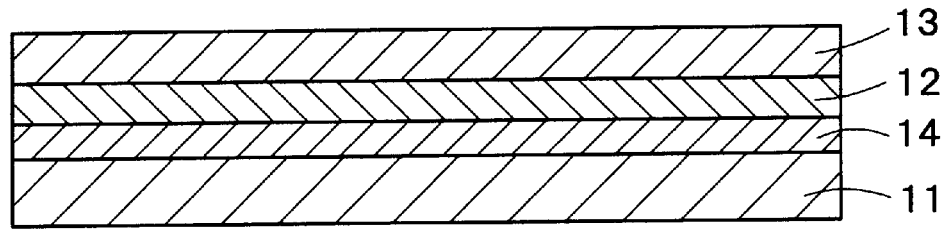
Figure 1C:
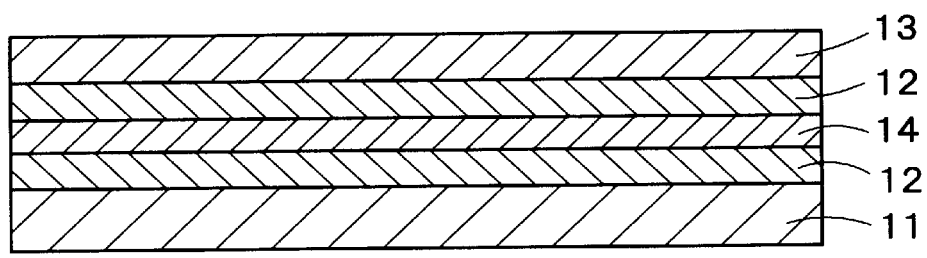

FIGS. 1A to 1C are schematic cross-sectional views of a stacked body 1 which may be used in the semiconductor manufacturing method according to the embodiment. Specifically, FIG. 1A is a view illustrating a first example of the stacked body 1. FIG. 1B is a view illustrating a second example of the stacked body 1. FIG. 1C is a view illustrating a third example of the stacked body 1.

As illustrated in FIG. 1A, the stacked body 1 of a first example sequentially includes a supporting substrate 11, a joining layer 12, and a semiconductor substrate 13. The supporting substrate 11 is attached, through the joining layer 12, to the semiconductor substrate 13 on the side thereof opposite to the rear surface 13a thereof to be ground (rear surface) in the thinning process. In other words, the supporting substrate 11 supports the semiconductor substrate 13 on the device surface 13b (top surface) where a device such as semiconductor element is formed. The joining layer 12 connects together the semiconductor substrate 13 and the supporting substrate 11, intervening between the substrates 11 and 13.

The semiconductor substrate 13 is, for example, silicon substrate (silicon wafer).

The supporting substrate 11 contains silicon (Si). For example, a single crystal silicon substrate is preferably used as the supporting substrate 11. By using a single crystal silicon substrate as the supporting substrate 11, mechanical characteristics of the supporting substrate 11 are almost with the same as those of the semiconductor substrate 13 (silicon substrate). As a result of the mechanical characteristics of the substrates 11, 13 being nearly identical, warping and cracking of the semiconductor substrate 13 may be avoided and further, handling of the semiconductor substrate 13 may resultantly be improved. Further, a single crystal silicon substrate has higher thermal conductivity than glass. Therefore, by using a single crystal silicon substrate as the supporting substrate 11, the supporting substrate 11 will better cool the entire stacked body 1 heated during the manufacturing process of the stacked body 1 and the embrittlement process of the joining layer 12. As the stacked body 1 is cooled effectively, the semiconductor substrate 13 is also cooled effectively. By effectively cooling the semiconductor substrate 13, changes in characteristics of the device formed on the device surface 13b may be reduced. The supporting substrate 11 may be also a glass ($SiO_2$, $SiSe_2$) substrate.

The joining layer 12 is embrittled by the energy of electromagnetic waves having energy of 0.11 to 0.14 eV. In other words, the joining layer 12 is embrittled (bulk fractured) by the energy of the electromagnetic waves. For example, a thermosetting adhesive (thermosetting resin) is preferably used for the joining layer 12. By using a thermosetting adhesive for the joining layer 12, the joining layer 12 better resists high temperatures of processes, such as the etching of the through silicon vias through the wafer 11 while the wafer and backing wafer 13 are still attached to one another. Since the joining layer 12 better resist the high temperatures of certain processes, the degree of freedom in the carrying out of these processes is increased. A thermoplastic adhesive (cooling and curing adhesive, thermoplastic resin) may be used for the joining layer 12.

Further, the joining layer 12 may have an absorption coefficient of 0.01 $\mu m^{-1}$ or more for electromagnetic waves having energy of 0.11 to 0.14 eV. Here, the absorption coefficient means a constant indicating how much the energy of the electromagnetic waves is absorbed by the joining layer 12 when the electromagnetic wave enters the joining layer 12, having a dimension of the inverse of length. When the absorption coefficient is defined as $\alpha$, the intensity of the electromagnetic waves before entering the joining layer 12 is defined as $I_0$, the intensity of the electromagnetic wave after entering the joining layer 12 is defined as I, and the distance of the electromagnetic wave passing through the joining layer 12 (medium) is defined as x, the absorption coefficient $\alpha$ may satisfy the following formula according to the Lambert-Beer law.

$$\alpha = (-1/x)\ln(I/I_0) \qquad (1)$$

Where ln is the logarithm of a number in base e.

By setting the absorption coefficient as 0.01 $\mu m^{-1}$ or more, the joining layer 12 may efficiently convert the electromagnetic energy of the electromagnetic waves entering thereinto into heat and will become embrittled.

As illustrated in FIG. 1B, the stacked body 1 of a second example is different from the stacked body 1 of the first example in that a conversion layer 14 is provided between the supporting substrate 11 and the joining layer 12. The conversion layer 14 converts the energy of the electromagnetic wave having energy of 0.11 to 0.14 eV into heat. The conversion layer 14 is embrittled or resolved by the converted heat (bulk fracture). By providing the conversion layer 14, the semiconductor substrate 13 may be separated more easily in the separating process of the semiconductor substrate 13 described later than in the case of only providing the joining layer 12.

Further, by providing the conversion layer 14 between the supporting substrate 11 and the joining layer 12, heat generated in the conversion layer 14 is somewhat insulated from the semiconductor substrate 13 by the joining layer 12, compared to the case where the conversion layer 14 is located between the joining layer 12 and the semiconductor substrate 13. Accordingly, changes in the electrical characteristics in a device may be further reduced and the quality of the resulting product may be improved. When the elements at or adjacent to the device surface 13b are not heat sensitive, the conversion layer 14 may be located between the joining layer 12 and the semiconductor substrate 13.

The conversion layer 14 uses an adhesive which includes, for example, silica. Silica has a high absorption ratio of electromagnetic waves having energy of 0.11 to 0.14 eV. Therefore, by including silica in the conversion layer 14, the semiconductor substrate 13 may be separated more easily from the stack after the joining layer 13 is treated with electromagnetic waves.

Further, the conversion layer 14 may include carbon black to convert electromagnetic wave energy into heat. In this case, in order to lessen the affect of the conductivity of the carbon black on the device, the upper limit of the content of the carbon black is preferably set at 5%.

As illustrated in FIG. 1C, the stacked body 1 of a third example is different from the stacked body 1 of the first example in that the joining layer 12 includes a conversion layer 14 therein. In other words, the conversion layer 14 is interposed by two joining layers 12. The functional effect of the conversion layer 14 is the same as that of the stacked body 1 of the second example.

Figure 2A:
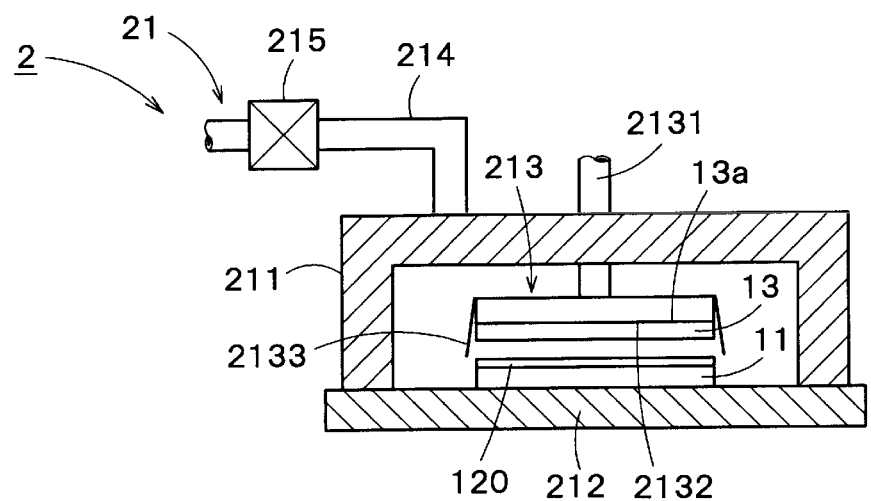
FIGS. 2A and 2B are schematic cross-sectional views of a vacuum bonding device of a semiconductor manufacturing system 2 according to the embodiment.
Figure 2B:
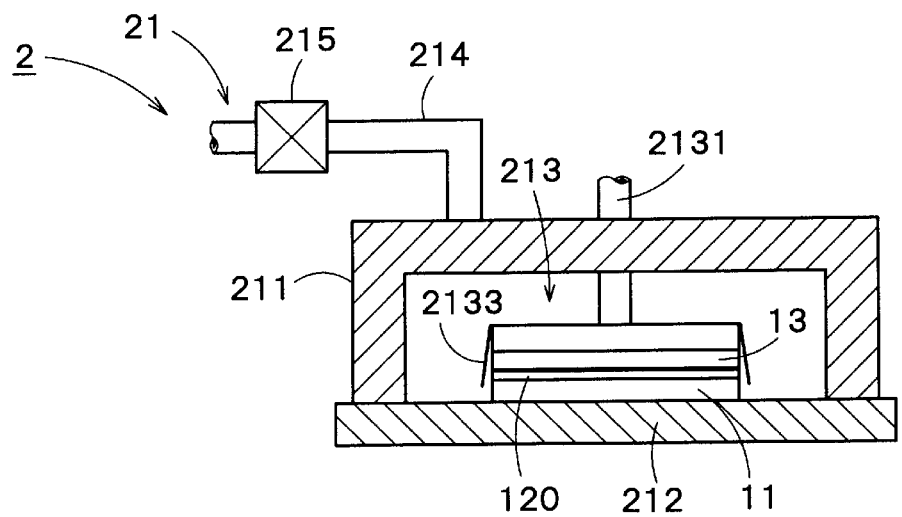

Next, an example of the structure of a device capable of carrying out the manufacturing process of the stacked body will be described. FIGS. 2A and 2B are schematic cross-sectional views of a vacuum bonding device (vacuum bonding unit) 21 of a semiconductor manufacturing system (semiconductor manufacturing device) 2 according to the embodiment. Specifically, FIG. 2A is a view illustrating the semiconductor substrate 13 before bonding (attaching) this substrate to the supporting substrate 11. FIG. 2B is a view illustrating the semiconductor substrate 13 being bonded to the supporting substrate 11.

The manufacturing process to form the stacked body 1 is performed, for example, using a vacuum bonding device 21 that is a portion of the semiconductor manufacturing system 2 in FIGS. 2A and 2B. The vacuum bonding device 21 is capable of manufacturing any of the stacked bodies 1 illustrated in FIGS. 1A to 1C.

As illustrated in FIGS. 2A and 2B, the vacuum bonding device 21 includes a vacuum chamber 211, a first holding unit 212, a second holding unit 213, piping 214, and a valve 215. Further, although not illustrated, the vacuum bonding device 21 may be provided with a heating device.

The vacuum chamber 211 is connected to a vacuum device, such as a vacuum pump (not illustrated), through the piping 214 and the valve 215.

The first holding unit 212 is positioned at the bottom of the vacuum chamber 211. The first holding unit 212 receives and holds the supporting substrate 11. The first holding unit 212 may receive and hold the semiconductor substrate 13.

The second holding unit 213 includes a shaft 2131, a holding surface 2132, and a clamp 2133. The second holding unit 213 may move (vertically) between a position near the first holding unit 212 and a position spaced further therefrom, according to the position of the shaft 2131 relative to the first holding unit 212. The shaft 2131 is driven by an actuator (not illustrated).

Next, the manufacturing process of the stacked body 1 using the vacuum bonding device 21 will be described.

As illustrated in FIG. 2A, at first, the supporting substrate 11 is mounted on the first holding unit 212, and an uncured adhesive 120 that is a previous form of the joining layer 12 is located on the surface of the supporting substrate 11. Here, the surface to be ground 13a of the semiconductor substrate 13 faces the second holding unit 213 and is held thereagainst by the holding surface 2132 at the position distant from the first holding unit 212 and the second holding unit 213 holds the peripheral portion of the semiconductor substrate 13 with the clamp 2133.

Then, the vacuum chamber 211 is evacuated by the vacuum pump to a vacuum state. By providing a vacuum state in the vacuum chamber 211, generation of voids in the adhesive 120 is suppressed. Since the generation of voids is suppressed, the supporting substrate 11 and the semiconductor substrate 13 may be properly adhered to each other through the adhesive 120.

Next, as illustrated in FIG. 2B, the second holding unit 213 moves to the position near the first holding unit 212 as a result of the movement of the shaft 2131. Then, when located at the position near the first holding unit 212, the second holding unit 213 releases the clamp 2133 from the semiconductor substrate 13 to release the semiconductor substrate 13. Here, the semiconductor substrate 13 overlies the supporting substrate 11 with the adhesive 120 therebetween. In other words, the adhesive 120 is interposed between the supporting substrate 11 and the semiconductor substrate 13.

By curing the adhesive 120 by heating to form the joining layer 12 at the same time, the supporting substrate 11 and the semiconductor substrate 13 are bonded (adhered) to each other by the joining layer 12. The supporting substrate 11 is bonded to the semiconductor substrate 13, and the stacked body is obtained 1 as a result.

(Semiconductor Substrate Thinning Process)

In the semiconductor manufacturing method according to the embodiment, after the manufacturing process of the stacked body 1, the thinning process of the semiconductor substrate 13 is performed on the manufactured stacked body 1. Before and after the process, the stacked body 1 may be automatically transferred using a carrying mechanism not illustrated. In the thinning process of the semiconductor substrate 13, the semiconductor substrate 13 is thinned, for example, by grinding or polishing the surface to be ground 13a of the semiconductor substrate 13 with a grinding or polishing device (not illustrated).

(Joining Layer Embrittlement Process)

In the semiconductor manufacturing method according to the embodiment, after the thinning process of the semiconductor substrate 13, the embrittlement process of the joining layer 12 is performed. Here, another process may be performed between the thinning process and the embrittlement process. The other process includes, for example, a washing process, a drying process, a forming process to form through silicon via(s) (TSV) in the wafer, and an electrode forming process.

Next, an example of the structure of a device capable of carrying out the embrittlement process of the joining layer 12 will be described.

Figure 3A:
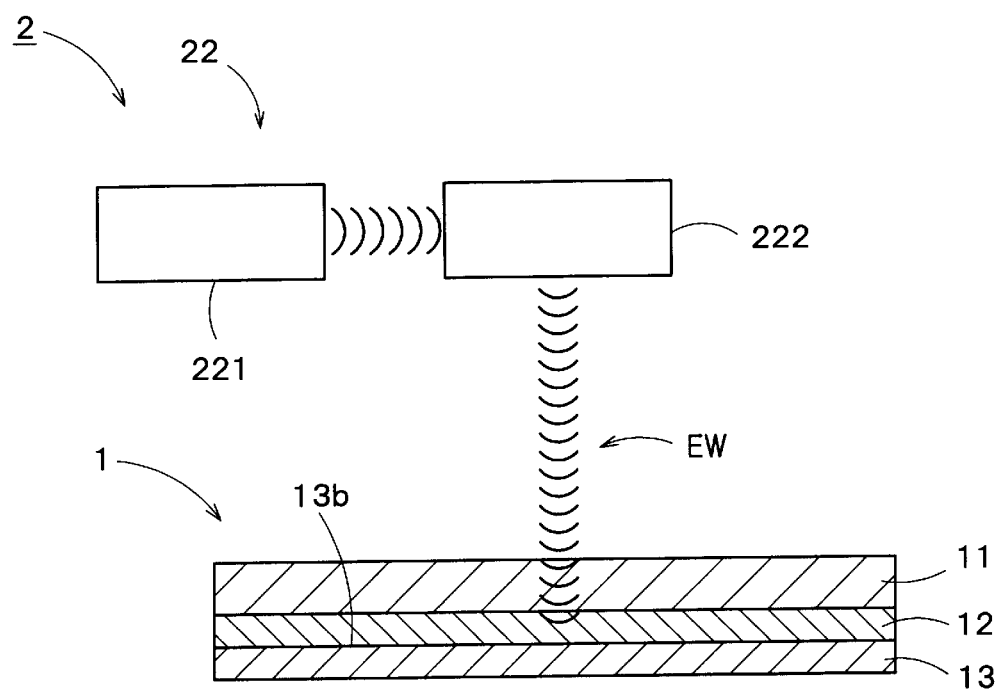
FIGS. 3A and 3B are schematic views of an irradiation device of the semiconductor manufacturing system according to the embodiment.
Figure 3B:
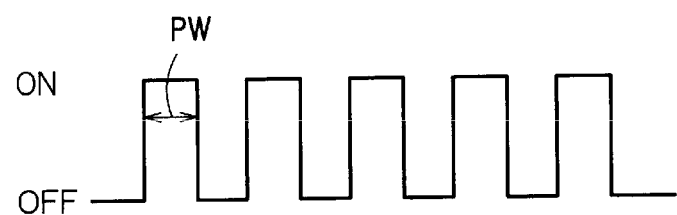

FIGS. 3A and 3B are schematic illustrations of an irradiation device (irradiation unit) 22 of the semiconductor manufacturing system 2 according to the embodiment. Specifically, FIG. 3A shows a schematic view of the irradiation device 22. FIG. 3B shows a view of the waveform of electromagnetic waves irradiated from the irradiation device 22.

The embrittlement process of the joining layer 12 is performed, for example, using the irradiation device 22 in FIG. 3A.

As illustrated in FIG. 3A, the irradiation device 22 includes an electromagnetic wave emitting device 221 and an electromagnetic wave scanning device 222. The electromagnetic wave emitting device 221 emits electromagnetic waves EW having energy of 0.11 to 0.14 eV. The electromagnetic wave emitting device 221 emits the electromagnetic waves more preferably with energy of 0.11698 to 0.13191 eV (wavelength of 9.4 to 10.6 µm). The electromagnetic wave emitting device 221 may generate the electromagnetic waves, for example, using recombination of carriers of a semiconductor; however, it is not limited to this process. The electromagnetic wave scanning device 222 scans the electromagnetic waves EW emitted from the electromagnetic wave emitting device 221 across the stacked body 1. The electromagnetic wave scanning device 222 may be, for example, a galvano-scanner.

Next, the embrittlement process of the joining layer 12 using the irradiation device 22 will be described.

As illustrated in FIG. 3A, at first, the stacked body 1 is arranged with the supporting substrate 11 facing toward the irradiation device 22 (electromagnetic wave scanning device 222) so that the supporting substrate is between the semiconductor substrate 13 and the irradiation source of the irradiation device 22. The stacked body 1 may be mounted on amounting surface (not illustrated) of the irradiation device 22.

Then, as illustrated in FIG. 3A, the irradiation device 22 irradiates the stacked body 1 with the electromagnetic waves EW having energy of 0.11 to 0.14 eV. Since the supporting substrate 11 is facing the irradiation device 22, the electromagnetic waves EW are irradiated on the supporting substrate 11 side of the stacked body 1 and thus are not directly irradiated on the semiconductor substrate 13. Since the semiconductor substrate 13 is not directly irradiated by the electromagnetic waves EW, effects of the electromagnetic wave EW on the devices resulting from the semiconductor substrate 13 (a change of the electrical characteristics thereof) may be suppressed.

Further, as illustrated in FIG. 3B, the irradiation device 22 intermittently emits the electromagnetic waves EW using a predetermined pulse width PW. By the intermittent irradiation of the electromagnetic wave EW, the effect of the electromagnetic energy on the devices resulting from the semiconductor substrate 13 may be further reduced than when using continuous irradiation. By shortening the pulse width PW to 50 ns or less, the effect on the devices resulting from the semiconductor substrate 13s may be almost eliminated.

The electromagnetic waves EW having energy of 0.11 to 0.14 eV have the property that they are difficult to scatter, as compared with to visible light. Therefore, even when the supporting substrate 11 is a substrate that does not transmit the visible light (for example, single crystal silicon substrate), the electromagnetic waves EW may be transmitted through the supporting substrate 11 and reach the joining layer 12.

The electromagnetic waves EW that reach the joining layer 12 embrittle the joining layer 12 by heating the joining layer 12. For example, the electromagnetic waves EW generate defects such as voids or cracks (resolution, bulk fracture) in the joining layer 12. By the embrittlement of the joining layer 12, the semiconductor substrate 13 is easily separated from the supporting substrate 11. Therefore, the semiconductor substrate 13 may be separated more easily from the supporting substrate 11 in the separating process of the semiconductor substrate 13.

(Semiconductor Substrate Separating Process)

In the semiconductor manufacturing method according to the embodiment, after the embrittlement process of the joining layer 12, the separating process of the semiconductor substrate 13 is performed.

Here, an example of the structure of a device capable of carrying out the separating process of the semiconductor substrate 13 will be described.

Figure 4A:
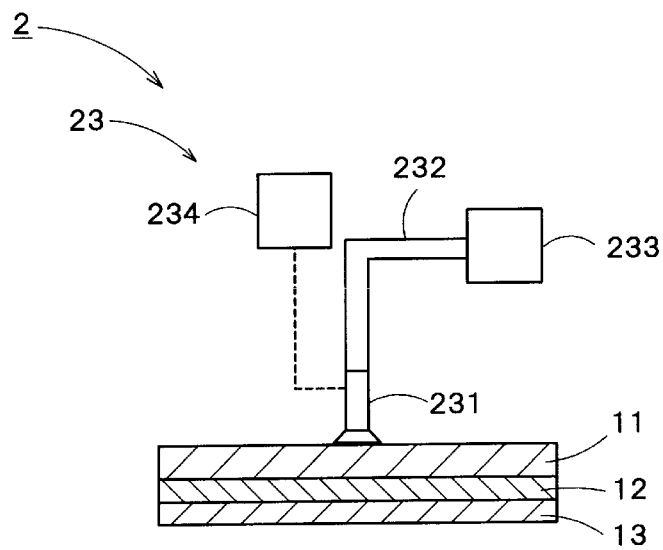
FIGS. 4A and 4B are schematic views of a separating device of the semiconductor manufacturing system according to the embodiment.
Figure 4B:
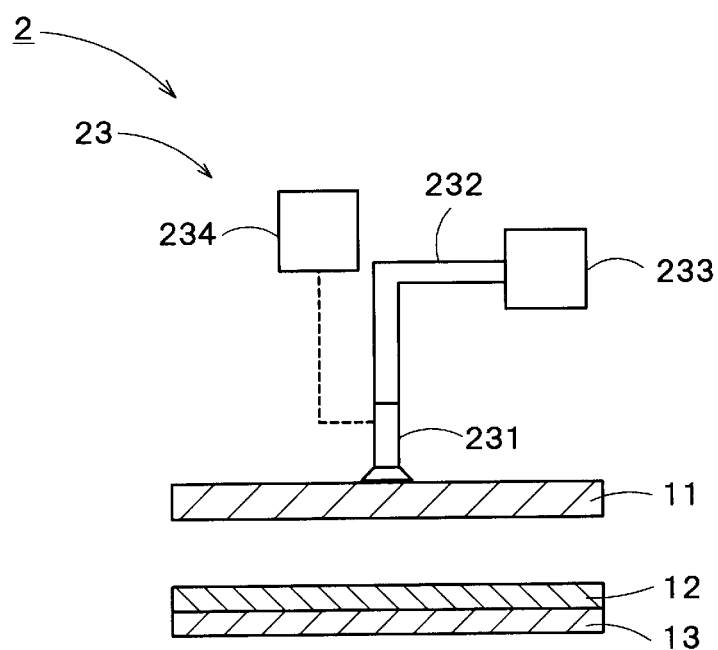

FIGS. 4A and 4B are schematic perspective views of a separating device (separating unit) 23 of the semiconductor manufacturing system 2 according to the embodiment. Specifically, FIG. 4A is a view illustrating the connected state of the semiconductor substrate 13 to the supporting substrate 11. FIG. 4B is a view illustrating the semiconductor substrate 13 separated from the supporting substrate.

The separating process of the semiconductor substrate 13 may be performed, for example, by the separating device 23 that is a portion of the semiconductor manufacturing system 2 in FIGS. 4A and 4B.

As illustrated in FIG. 4A, the separating device 23 includes a suction unit 231, piping 232, a vacuum device 233, and a moving device 234. The suction unit 231 is formed to be hollow. The suction unit 231 is connected to the vacuum device 233 through the piping 232. Although not illustrated, the suction unit 231 is provided with a plurality of through-holes penetrating the absorption unit 231 in the suction surface thereof facing the semiconductor substrate 13. The moving device 234 may move the suction unit 231 in a direction of coming close to and away from the stacked body 1.

The separating process of the semiconductor substrate 13 using the separating device 23 will be described.

As illustrated in FIG. 4A, at first, the stacked body 1 is arranged with the supporting substrate 11 facing the separating device 23. The bottom surface of the stacked body 1 may be fixed to the mount surface, not illustrated, of the separating device 23, by vacuum suction.

Next, the suction unit 231 is moved by the moving device 234 to a position to come into contact with the stacked body 1, while providing suction to the interior of the suction unit 231 using the vacuum device 233. According to this, the supporting substrate 11 in the uppermost layer of the stacked body 1 is vacuum chucked by the suction unit 231.

While the supporting substrate 11 is vacuum chucked, the suction unit 231 is moved away from the stacked body 1 by the moving device 234. Here, the joining layer 12 between the supporting substrate 11 and the semiconductor substrate 13 was embrittled during the above-described embrittlement process. In other words, the coupling between the supporting substrate 11 and the semiconductor substrate 13 by the joining layer 12 is weaker than the vacuum coupling between the suction unit 231 and the supporting substrate 11. Accordingly, as illustrated in FIG. 4B, when the suction unit 231 is moved away from the stacked body 1 while the substrate 13 is chucked to the base of the separating device 23, the supporting substrate 11 is pulled away from the semiconductor substrate 13. As a result, the semiconductor substrate 13 is separated from the supporting substrate 11.

The joining layer 12 is removed from the separated semiconductor substrate 13 using mechanical polishing or wet etching, and after dicing the substrate into individual pieces, the individual pieces of the semiconductor substrate 13 may be packaged. Further, the individual pieces of the semiconductor substrate 13 may be three-dimensionally mounted into 2.5 or three dimensional stacked packages using the TSV(s).

According to the embodiment, by irradiating the joining layer 12 with electromagnetic waves having energy of 0.11 to 0.14 eV, the joining layer 12 is embrittled even if the material of the supporting substrate 11 is opaque. For example, even when the supporting substrate 11 is a substrate such as single crystal silicon that does not transmit visible light, electromagnetic waves having energy of 0.11 to 0.14 eV will embrittle the joining layer 12 by heating the joining layer 12. Therefore, according to the embodiment, the degree of freedom in selecting the material of the supporting substrate may be increased.

Further, if the supporting substrate 11 is formed of single crystal silicon, the generation of warping or cracks in the semiconductor substrate 13 is suppressed, and the handling properties the semiconductor substrate 13 are improved. That is, the yield and the ease of manufacture of the semiconductor device are improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

For example, although the embodiment has been described in the case of using the silica for the conversion layer 14, a metal layer (for example, Ti, Ta, Ni, Cu, Al, or alloy or multi-layered film thereof) may be used for the conversion layer 14. When a metal film is used for the conversion layer 14, the conversion layer 14 itself is not embrittled; however, the joining layer 12 may be embrittled by transmitting heat from the conversion layer 14 to the joint layer 12.

APPENDIX

Appendix-A

The semiconductor manufacturing method in which the pulse width of the electromagnetic wave is 50 ns or less.

Appendix-B

The semiconductor manufacturing method in which the absorption coefficient of the electromagnetic wave in the joining layer is 0.01 $\mu m^{-1}$ or more.

Appendix-C

The semiconductor manufacturing method in which the supporting substrate is a glass substrate.

Appendix-D

The semiconductor manufacturing method in which the stacked body includes a conversion layer for converting the electromagnetic wave to heat between the joining layer and the semiconductor substrate, the method including embrittling the conversion layer by irradiating the stacked body with electromagnetic waves from the supporting substrate side thereof.

Appendix-E

The semiconductor manufacturing method in which the conversion layer contains Ti, Ta, Ni, Cu, and Al.

What is claimed is:
1. A semiconductor manufacturing method for a stacked body that includes a semiconductor substrate having a semiconductor device on a first surface and having a second surface opposite to the first surface, a supporting substrate containing silicon, and a joining layer between the semiconductor substrate and the supporting substrate to join the semiconductor substrate and the supporting substrate together, in which the first surface is facing the joining layer, the method comprising:

grinding the semiconductor substrate from the second surface, irradiating the stacked body with electromagnetic waves having energy of 0.11 to 0.14 eV from the supporting substrate side of the stacked body, thereby generating defects in the joining layer, the electromagnetic waves being pulsed electromagnetic waves having a pulse width shorter than 50 ns; and separating the semiconductor substrate from the supporting substrate, wherein the supporting substrate is a single crystal silicon substrate.

2. The method according to claim 1, wherein the electromagnetic waves have energy of 0.11698 to 0.13191 eV.

3. The method according to claim 1, wherein the semiconductor substrate is a single crystal silicon substrate.

4. The method according to claim 1, wherein the joining layer comprises at least one of a thermosetting resin and a thermoplastic resin.

5. The method according to claim 1, wherein the stacked body includes a conversion layer between the supporting substrate and the joining layer or within the joining layer configured to convert the electromagnetic waves into heat therein.

6. The method according to claim 5, wherein the conversion layer comprises at least one of silica, carbon black or metal.

7. A method of forming a semiconductor device, comprising:

forming a stacked body comprising a semiconductor substrate comprising one or more integrated circuits being provided on a first surface of the semiconductor substrate, a supporting substrate which is not transparent to visible light, and a joining layer therebetween connecting the semiconductor substrate and the supporting substrate, in which the first surface is facing the joining layer;

grinding the semiconductor substrate from a second surface of the semiconductor substrate opposite to the first surface, directing electromagnetic waves at the supporting substrate at energy which will pass through the supporting substrate and heat the joining layer, thereby generating defects in the joining layer, the electromagnetic waves being pulsed electromagnetic waves having a pulse width shorter than 50 ns; and removing the supporting substrate from the stacked body, wherein the supporting substrate is a single crystal silicon substrate.

8. The method of claim 7, wherein the directing electromagnetic waves at the supporting substrate further comprises scanning the electromagnetic waves over the supporting substrate.

9. The method of claim 7, wherein said generating detects in the joining layer comprises embrittling the joining layer as a result of the heating thereof by the electromagnetic waves.

10. The method of claim 7, wherein the electromagnetic waves have energy of 0.11 to 0.14 eV.

11. The method of claim 7, wherein the electromagnetic waves have energy of 0.11698 to 0.13191 eV.

12. The method of claim 7, further comprising selecting a supporting substrate material to be substantially transmissive to the electromagnetic waves.

13. The method of claim 7, further comprising selecting a joining layer material which absorbs the electromagnetic waves to result in heating of the joining layer.

14. The method of claim 7, further comprising providing a conversion layer between the supporting substrate and the semiconductor substrate to absorb the electromagnetic waves and convert the electromagnetic waves to heat.

15. The method of claim 14, wherein the heat of the conversion layer is transferred to the joining layer.

16. The method of claim 15, wherein the conversion layer comprises at least one of silica, carbon black or metal.

17. The method of claim 7, wherein the semiconductor substrate comprises a single crystal silicon substrate.

* * * * *